(12) United States Patent
Frazier et al.

(10) Patent No.: US 6,359,520 B1
(45) Date of Patent: Mar. 19, 2002

(54) OPTICALLY POWERED RESONANT TUNNELING DEVICE

(75) Inventors: Gary Frazier, Garland; William Frensley, Richardson, both of TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/740,885

(22) Filed: Dec. 21, 2000

(51) Int. Cl.[7] .................................................. H03B 7/08
(52) U.S. Cl. ............................ 331/66; 331/56; 331/74; 331/96; 331/107 T; 331/185
(58) Field of Search ............................ 331/46, 56, 65, 331/66, 74, 96, 107 T, 185, 186

(56) References Cited

U.S. PATENT DOCUMENTS

| 4,985,621 | A | * | 1/1991 | Aull et al. | 250/213 A |
| 5,126,553 | A | * | 6/1992 | England et al. | 250/211 J |
| 5,144,261 | A | * | 9/1992 | Harvey et al. | 331/66 |
| 5,223,802 | A | * | 6/1993 | Harvey et al. | 331/177 R |
| 5,389,782 | A | * | 2/1995 | Hilliard | 250/227.17 |

* cited by examiner

*Primary Examiner*—David Mis
(74) *Attorney, Agent, or Firm*—Baker Botts L.L.P.

(57) ABSTRACT

An improved resonant tunneling device (RTD) oscillator is provided by supplying electrical power to the RTD device 23 using a photocell 21 and a light source 25 such that essentially no spurious resonances are possible.

12 Claims, 5 Drawing Sheets

DIFFERENTIAL CONDUCTANCE VERSUS BIAS FOR 100 KA/cm² RTD AREA 1 μm²

I-V FOR p-n JUNCTION PHOTOCELL

OPTICALLY POWERED RESONANT TUNNELING DEVICE

BACKGROUND OF THE INVENTION

1. Field of the Invention

This invention relates to resonant tunneling devices (RTDs) and more particularly to methods for supplying electrical power to resonant tunneling devices.

2. Background of Invention

Sub-millimeter wavelength microwave oscillators are essential microwave components. They are used as local oscillators within millimeter wavelength radio receivers and as the basic frequency-determining function within millimeter wavelength radio transmitters. Since the possible bandwidth of information impressed on a frequency carrier is proportional to the carrier frequency, oscillators that operate above 1000 GHz (1 Terahertz) would allow unprecedented modulation bandwidth relative to current technology. Typically, field effect transistors, bipolar transistors, impact ionization diodes, and Gunn-effect diodes are used in microwave oscillators, but these devices have inherent frequency limitations due to their size which limits speed due to transit time effects. Resonant tunneling diodes (RTDs) are semiconductor devices with very high intrinsic gain and switching speed and would allow microwave oscillators to be constructed for frequency bands well above 1000 GHz. However, resonant tunneling diode oscillator circuits are very difficult to electrically bias so that the bias circuitry does not resonate with the RTD and produce unwanted modes of oscillation. Reddy et. al. provided one method for properly biasing RTDs in microwave oscillators based on the use of transmission lines and Schottky diodes. REF: M. Reddy, et. al. "Bias Stabilization for Resonant Tunnel Diode Oscillators," IEEE Microwave and Guided Wave Letters, Vol. 5, No.7, July 1995. However, this method still allows the parasitic resonances to occur in the power supply circuitry. Therefore there remains the general problem of providing RTD-based circuits that oscillate at ultra high frequency while suppressing lower frequency oscillations.

SUMMARY OF THE INVENTION

In accordance with one embodiment of the present invention the problem of providing a low inductance, high capacitance means to supply power is to use a photocell to power and bias the RTD such that essentially no spurious resonances are possible.

DESCRIPTION OF PREFERRED EMBODIMENTS

Figure 1:
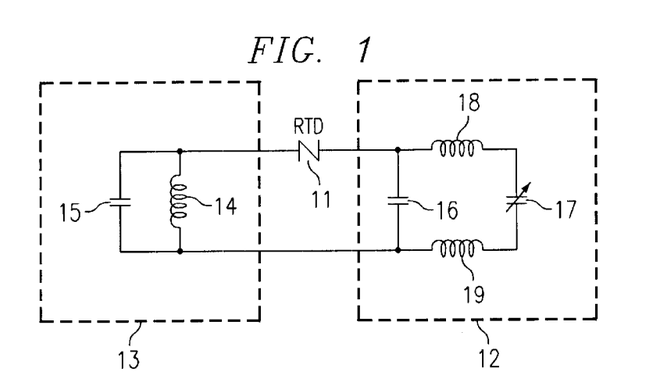
FIG. 1 illustrates a power supply with leads to an RTD oscillator according to prior art.

Resonant tunneling diodes have intrinsic electrical gain which allows them to be used in amplifiers and oscillators up to at least several hundreds of GHz. Referring to FIG. 1 a typical RTD-based oscillator 10 may contain RTD 11 with a power supply 12 and resonant circuit 13. Resonant circuit 13 may consist of an inductor 14 and capacitor 15 tuned to the desired radio frequency. The power supply 12 may consist of a RF bypass capacitor 16, a voltage source such as battery 17, and wires consisting of inductors 18 and 19 that connect the voltage source to the bypass capacitor, RTD, and tuned circuit. The RTD has electrical gain from zero frequency (dc) to an upper limit Fmax. Because the gain of the RTD tends to decrease with frequency, the lowest characteristic resonant frequency of the circuitry of oscillator 10 will tend to set the frequency of RTD oscillation. This is a special problem at high microwave frequencies where the RTD gain tends to roll off with increasing frequency. Due to the inherently greater gain at low frequencies, a circuit containing an RTD may tend to oscillate at a low frequency set by the relatively large values of inductance in the power supply wiring rather than at the desired microwave frequency. This problem has been noted by M. Reedy. et. el. (See prior citation in text) where special precautions were required to properly bias and decouple the power supply circuit from a 6.9 GHz RTD oscillator. In the approach of Reddy, a tuned transmission line and bypass capacitor were used to isolate the bias voltage source form the RTD and microwave resonator. However, this approach will not be preferable at frequencies of 500 GHz or greater where the RTD gain is rolling off very rapidly with increasing frequency. Even well-decoupled power wiring may still cause undesired oscillation effects.

Figures 2, 3:
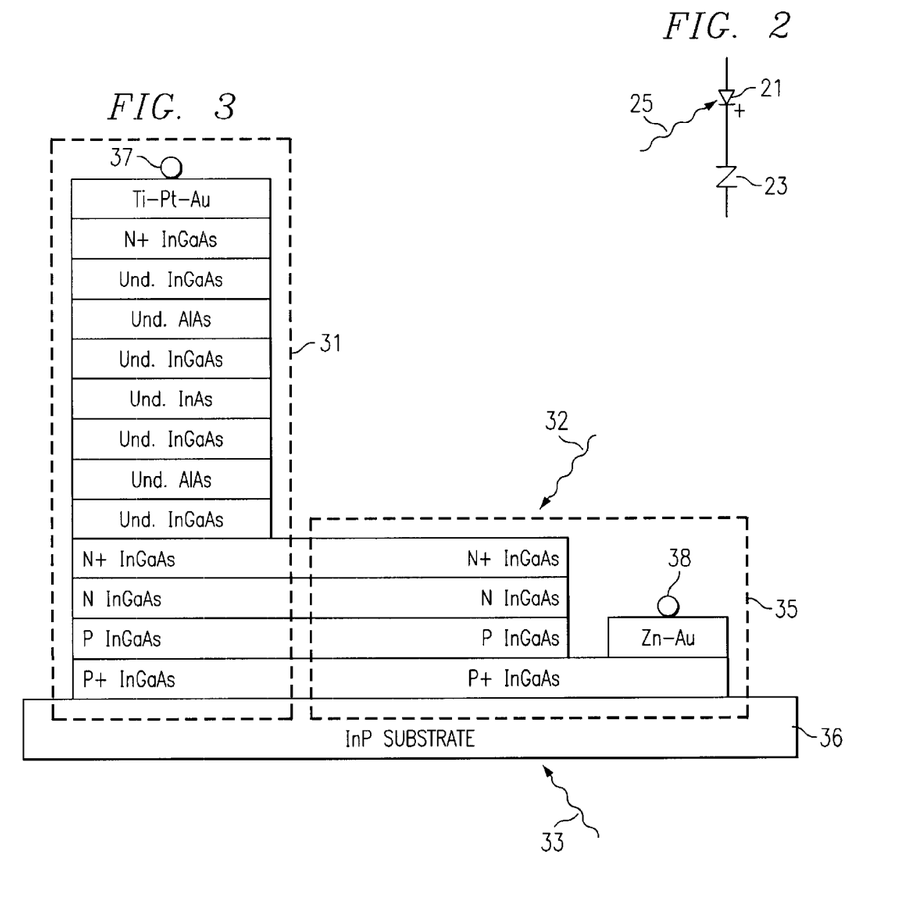
FIG. 2 illustrates a circuit diagram illustrating an embodiment of the present invention.
FIG. 3 illustrates the structure of one embodiment of the present invention.

Referring to FIG. 2 there is illustrated a circuit diagram of one embodiment of the present invention where a photocell is used to supply electrical power an RTD. In this embodiment a photocell in 21 is in series with the RTD device 23. The photocell 21 absorbs optical radiation 25 and converts this radiation into electrical power for energizing the RTD.

Referring to FIG. 3 there is illustrated a cross-sectional view of an epitaxial structure of the series structure of FIG. 2 according to one embodiment of the present invention. The structure comprises the multilayer RTD 31 sitting upon a multilayer p-n junction photocell 35. The photocell 35 sits upon a substrate 36. The terminals are 37 and 38 across which a further circuit may be connected. Optical illumination 32 and 33 are provided to empower the circuit.

Figure 4:
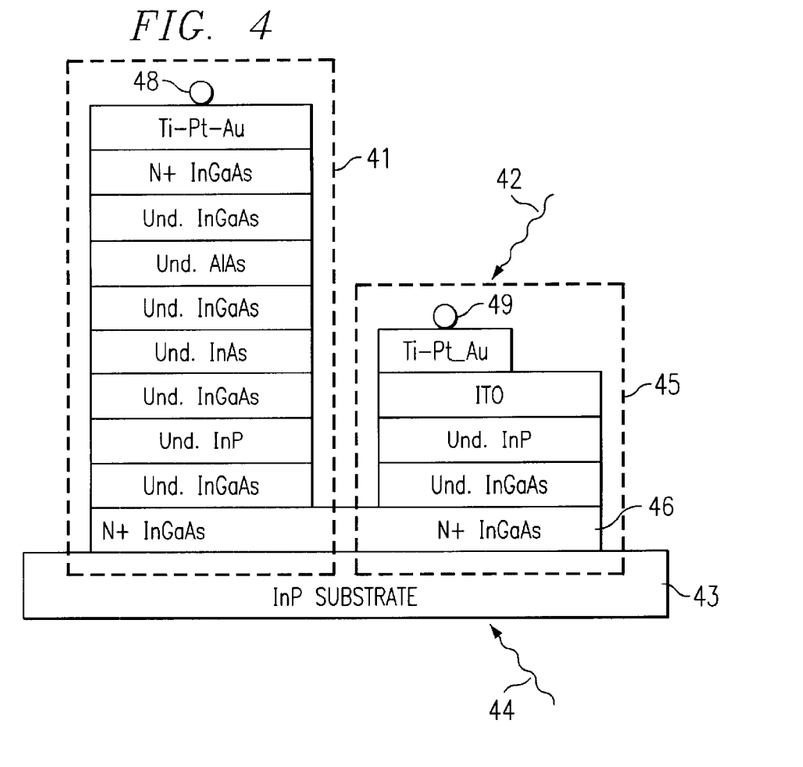
FIG. 4 the structure of a second embodiment of the present invention.

Referring to FIG. 4 there is illustrated a second structure comprised of a multilayer RTD 41 sitting on a common substrate 43 and a multilayer photocell 45 sitting a common substrate. Layer 46 is common to both the RTD 41 and photocell 45. Optical illumination 42 and 44 are provided to empower the circuit. The terminals 48 and 49 are connected respectively to the RTD and photocell and may be further connected to an external circuit.

As is very well known in the art, a resonant tunneling diode, also known as the quantum well diode, utilizes the tunneling of electrons through a pair of potential energy barriers to produce negative differential conductance effects. A RTD typically consists of a multi-layer stack (heterostructure) of epitaxially grown semiconductor material so formed to produce a single quantum energy well surrounded by twin energy barriers. Electrons incident upon this structure will be reflected from the structure except for certain well defined energies. These energies correspond to resonant energy levels within the quantum well, and conductance through the structure for these energies is very efficient. A typical design for a very high frequency RTD is given in Table 1. These layers are grown using molecular beam epitaxy or chemical vapor deposition methods using compounds of Indium (In), Arsenic (As), Gallium (Ga), Aluminum (Al), and Phosphorous (P). RTDs based on InGaAs quantum wells and AlAs tunnel barriers are easily grown on standard InP substrates. Various dopants such as silicon and boron can be used to alter the conductivity of each layer. Such diodes can also be fabricated using AlGaAs compounds on GaAs substrates.

TABLE 1

Typical Resonant Tunneling Diode Heterostructure.

| Layer Name | Material | Doping Density | Thickness in Angstroms or Monolayers |
|---|---|---|---|
| Top Contact | InGaAs | 2E19/cc | 500 Angstroms |
| Spacer | InGaAs | undoped | 50 Angstroms |
| Aluminum | AlAs | undoped | 6 monolayers |
| Quantum Well | InGaAs | undoped | 10 Angstroms |
| Quantum Well | InAs | undoped | 20 Angstroms |
| Quantum Well | InGaAs | undoped | 10 Angstroms |
| Aluminum | AlAs | undoped | 6 monolayers |
| Spacer | InGaAs | undoped | 70 Angstroms |
| Bottom Contact | InGaAs | 2E19/cc | 2000 Angstroms |
| Substrate | InP | undoped | 0.018 inches |

Figure 5:
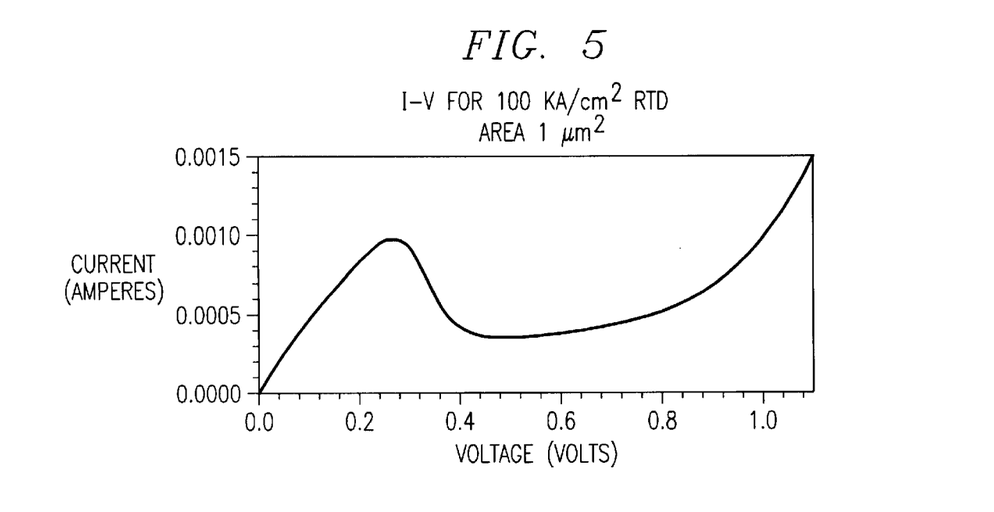
FIG. 5 illustrates I–V plot of an RTD.
Figure 6:
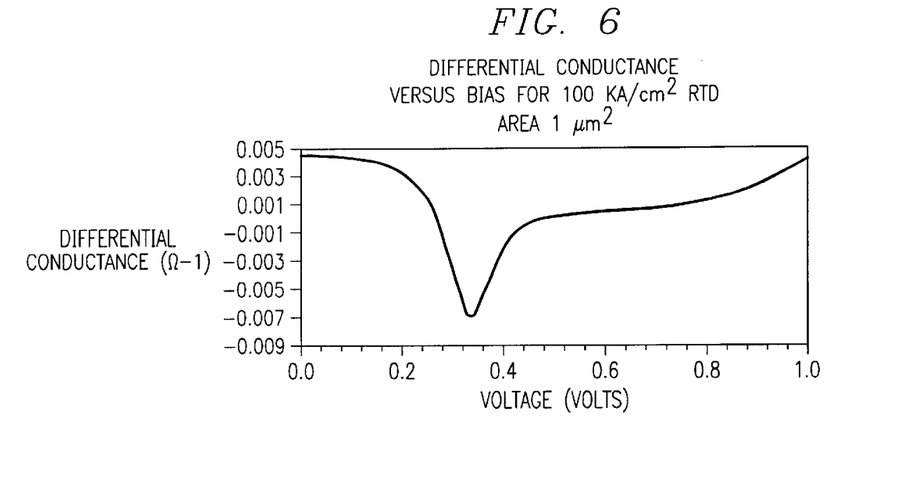
FIG. 6 is a plot of differential conductance versus voltage of an RTD.

Under electrical bias between the top contact and the bottom contact, the electrical current in the diode will first rise with increasing bias, then precipitously drop with further bias, then rise again with even further bias as shown in FIG. 5. FIG. 5 shows the current versus voltage response of the RTD of Table 1 that exhibits 100,000 amperes/cm$^2$ of current at the first resonance. The response is for a device of 1 square micrometer of cross-sectional area. The initial rise and peak in the diode current, at about 0.28 volts of bias, is due to quantum mechanical tunneling of electrons through the lowest energy conduction band resonance established within the heterostructure. The second rise in current after 0.5 volts of bias is due to the onset of tunneling through the next higher energy resonance. The falloff in current, at bias voltages between 0.28 and 0.5 volts in the Figure has a negative slope. The negative differential conductance (or conversely the negative differential resistance) associated with this bias regime for this device is shown in FIG. 6. Within this bias range the RTD can be used as a gain element for amplification or oscillation. The maximum negative differential conductance (−6.96E-3 ohms$^{-1}$) occurs at about 0.35 volts in this exemplary device, which is also the bias point of maximum available gain. Connecting the RTD to a resonant electrical circuit can produce amplification and oscillation if the magnitude of the RTD gain exceeds the losses within the circuit. This ability to support amplification and oscillation within an electronic circuit is characteristic of any electrical device that exhibits negative differential conductance. REF: "Basic Theory And Application of Tunnel Diodes," S. P. Gentile, Van Nostrand, Princeton N.J. (1962) At the present state of the art, the resonant tunneling diode is the fastest semiconductor with intrinsic electronic gain. RTDs have been shown to oscillate above 700 GHz. (REF:Brown et. al. "High Frequency Resonant Tunneling Oscillators," Microwave and Optical Technology Letters, Vol. 4, No.1, January 1991, pp-19–23) Therefore, the fastest oscillators based on semiconductor gain elements must currently employ resonant tunneling diodes.

Figure 7:
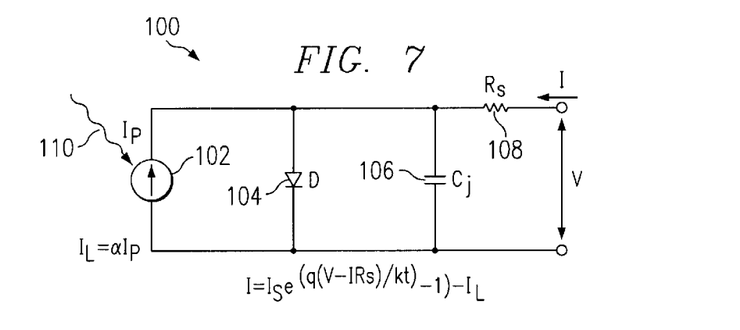
FIG. 7 illustrates an equivalent electrical model of a p-n junction photocell.
Figure 8:
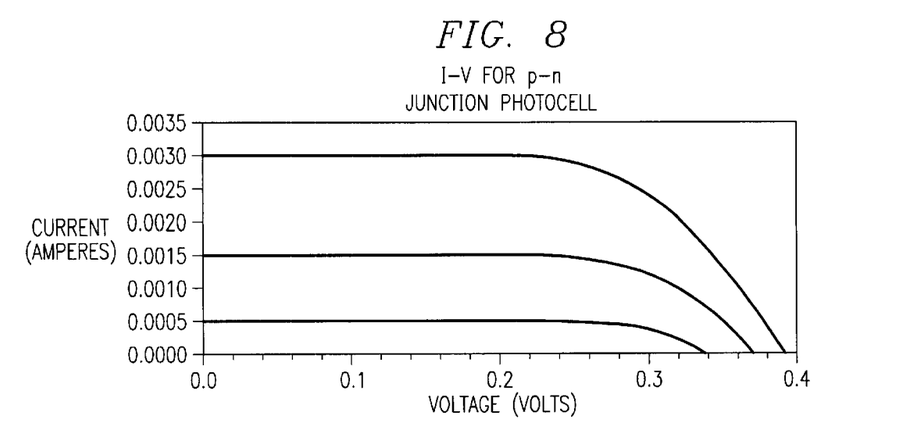
FIG. 8 illustrates an I–V plot for p-n junction photocell.

An established equivalent electrical model of a p-n junction photocell is shown in FIG. 7. (Reference: "Physics of Semiconductor Devices, S. M. Sze, John Wiley and Sons, Chapter 14, (1981) [ISBN 0-471-05661-8]" The photocell 100 is represented by a controlled current source 102, a shunt diode 104, a junction capacitance 106 and a series output resistance 108. The capacitor 106 is generally a direct function of the area of the diode. The series resistor 108 is dependent upon the types and thicknesses of the materials used to fabricate the diode. The amplitude $I_L$ of the current source 102 is directly proportional to the level Ip of optical illumination 110. The output voltage across the terminals of the photodiode are determined by the external load resistance, the photocurrent $I_L$, the current versus voltage response of the internal diode 104, and the voltage drop across the series resistor 105. FIG. 8 shows the calculated dc output current versus output voltage response of a typical p-n junction photocell. A series resistance of 10 ohms was used in the calculation. As the level of optical illumination increases from one, three, and 6 times a reference value, the short-circuit output current form the diode increases respectively to 0.5, 1.5, and 3 milliamperes. For the same range of illumination, the open-circuit voltage across the diode falls in the range of 0.34 and 0.39 volts. The dc resistance of the diode changes with illumination. The lowest value of equivalent resistance of the photodiode occurs in the region of zero current. At the highest level of illumination shown in FIG. 8, the dc resistance of the photocell is about 34 ohms near the open-circuit condition.

A photodiode based on metal-semiconductor junctions, called the Schottky photocell, is an alternative to the p-n junction diode. Many different types of p-n and Schottky photocell are possible, and many semiconductor materials may be used to build photocells.

Figure 9:
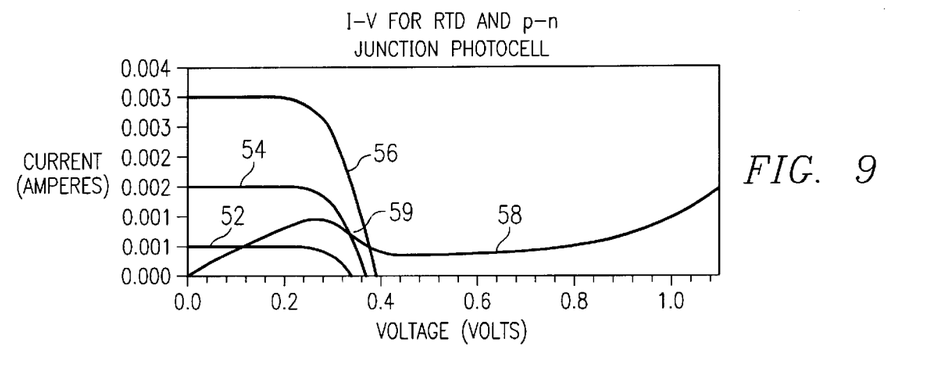
FIG. 9 illustrates the I–V plot for RTD and p-n junction photocell.

FIG. 9 shows the I–V curve 58 of the RTD of FIG. 5 and the I–V characteristic of a typical p-n or Schottky diode photocell under several levels of optical illumination. At low levels of optical illumination, the I–V characteristic of a photocell may be described by curve 52. At moderate levels of optical illumination, the I–V characteristic of a photocell may be described by curve 54. At high levels of optical illumination, the I–V characteristic of a photocell may be described by curve 56. To properly bias the RTD for operation as an amplifier or oscillator, the optical illumination of the photocell must be adjusted such that the I–V characteristic of the photocell intercepts the I–V of the RTD at its point of maximum negative differential resistance 59 of the RTD. This condition is illustrated best by curve 54.

To employ the RTD as a stable amplifier or oscillator it is necessary to electrically bias the RTD with a dc voltage that maintains the average voltage across the RTD within its negative resistance region.

The electrical properties of photocell 21 should meet several requirements to serve as a useful power source for RTD 23. First, it should present a very low impedance at the desired RF operating frequency so that the photocell does not impeded RF currents within the circuit. The requirement of a low impedance can be met by using a photocell of sufficient area that its junction capacitance provides a sufficiently low reactive impedance to the RTD. In one embodiment, the magnitude of the reactance of this junction capacitance may be made less than 1 ohm at the operating frequency. At an operating frequency of 500 GHz, the junction capacitance of the photocell 21 may be set greater than or equal to $1/2\pi F = 1/6.28 * 500E9 = 0.3$ Picofarads. Typical p-n and Schottky photocells can achieve this junction capacitance with an area of about 100 square micrometers. The second requirement of the photocell is that it present a sufficiently low dc resistance to the RTD circuit to ensure proper bias stability. The dc resistance presented by the photocell to the RTD must be less than the magnitude of the peak negative differential resistance of the RTD. This ensures that the intercept of the I–V load line established by the photocell, as in curve 54 of FIG. 9, intercepts the RTD I–V at only one bias point. In equation form, proper operation of an amplifier or oscillator containing a series-connected RTD and photocell requires that $$-R_{RTD}(dc) > R_{Photocell}(dc) \qquad \text{Equation 1}$$

where $R_{RTD}(dc)$ is the differential dc resistance of the RTD and $R_{Photocell}(dc)$ is the equivalent differential dc conductance of the photocell connected in series with the RTD. As an example, the peak negative differential resistance of the RTD of FIG. 9 is about $(1/-6.46E-3) = -154$ ohms. For this RTD to be correctly used in an amplifier or oscillator the effective dc resistance placed across the RTD must be less than 154 ohms. To provide design margin, $R_{Photocell}$ is should be limited to a value no greater than $1/2$ of $(-R_{RTD})$. If the rest of the circuit also has non-zero dc resistance, the dc resistance of the photocell must be reduced further by a similar amount. The differential dc resistance indicated by the simulated I–V trace 54 is about 40 ohms at bias point 59. Therefore, a photocell that provides an I–V similar to curve 54 would have a suitable differential dc resistance.

Figure 10:
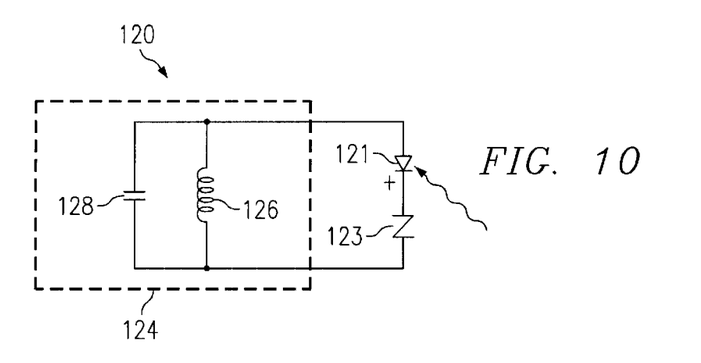
FIG. 10 illustrates a circuit diagram of an RTD oscillator according to an embodiment of the present invention.
Figure 11:
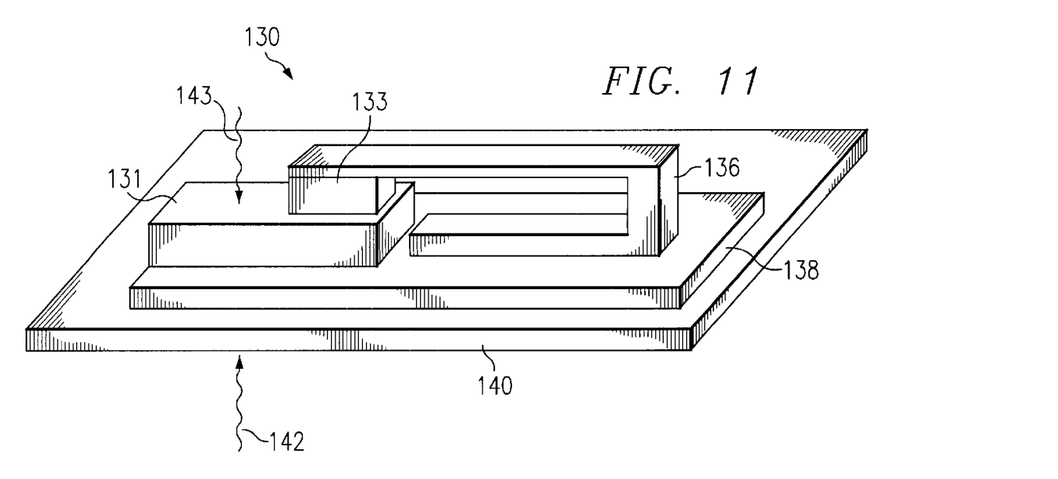
FIG. 11 illustrates an RTD oscillator structure according to an embodiment of the present invention.

Referring to FIG. 10 an RTD-based oscillator 120 may contain photocell 121, RTD 123 and resonant circuit 124. Resonant circuit 124 may consist of an inductor 126 and capacitor 128 tuned to the desired oscillation frequency. FIG. 11 shows the cross-section of a monolithic oscillator 130 consisting of a photocell circuit 131, an RTD 133 and an inductive strap 136. Inductive strap 136 has an equivalent inductance and parasitic capacitance so as to provide the function of resonator 124 in oscillator 120. The N+ layer 138 serves to interconnect the end of the inductor 136 to photocell 131. In this embodiment, the material used for N+ layer 138 and the substrate 140 may be selected such that they are optically transparent to the spectral region absorbed by photocell 131. This allows optical illumination 142 of photocell 131 to be coupled via the substrate side of the oscillator. Generally, optical illumination 143 may be used to empower the circuit.

Figure 12:
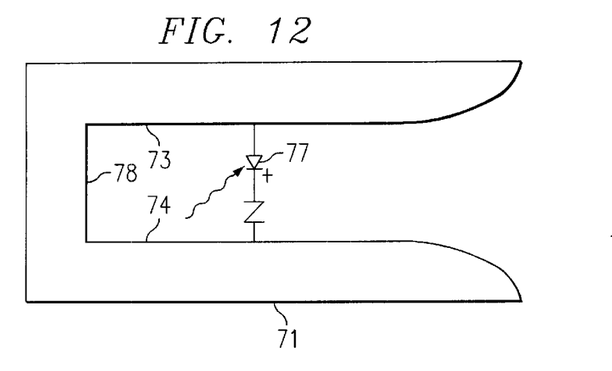
FIG. 12 illustrates another embodiment using a traveling wave antenna.

Referring to FIG. 12 there is illustrated an embodiment of an optically power oscillator using a traveling wave antenna 71 which may be covered with a conductive gold layer has a RTD and solar cell series set 77 placed across the walls 73 and 74 at a point from wall 78 that resonates the system at a desired frequency. The serially connected RTD and photocell will have a particular value of impedance at any given frequency. The impedance measured across the slot formed by wall 73 and 74 will vary as a function of the distance away from the shorting wall 78. For example, very near the wall 78, the impedance of the slot will measure out as a very low inductance. For points slightly further away than one quarter of a electrical wavelength, the slot will measure out as slightly capacitive. To operate the circuit of FIG. 12 as an oscillator at a frequency F, the set 77 should be located along the slot such that the impedance of the slot is the complex conjugate of the impedance of the set 77. In this manner, the effective reactance of the set 77 will be cancelled by the conjugate reactance of the slot. This is the preferred point of location of set 77 to serve as an oscillator at frequency F. This circuit may be used as a transmitter or local oscillator in a high frequency receiver circuit. The circuit may be fabricated on the same substrate that carries the set 77, or the antenna 71 may be deposited onto a substrate such as quartz or Mylar plastic and the set 77 physically and electrically bonded to the antenna using standard flip-chip or other well known techniques.

Figure 13:
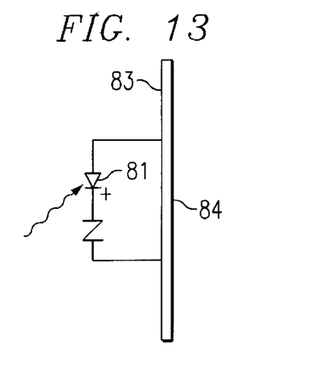
FIG. 13 illustrates another embodiment using a dipole antenna.

Referring to FIG. 13 there is illustrated a serially connected RTD and photocell set 81 placed across the dipole 83 so that the combination can work as either a transmitter or free-space local oscillator for a receiver circuit. The impedance measured across the dipole 83 will vary as a function of the distance away from the center 84. For example, very near the center 84, the impedance of the dipole will measure out as a very low and inductive. The impedance of points slightly further away than center will increase. To operate the circuit of FIG. 13 as an oscillator at a frequency F, the set 81 should be electrically attached to the dipole such that the impedance of the dipole is the complex conjugate of the impedance of the set 81. In this manner, the effective reactance of the set 81 will be cancelled by the conjugate reactance of the dipole. This is the preferred point of location of set 81 to serve as an oscillator at frequency F. This circuit may be used as a transmitter or local oscillator in a high frequency receiver circuit. The circuit may be fabricated on the same substrate that carries the set 81, or the antenna 83 may be deposited onto a substrate such as quartz or Mylar plastic and the set 81 physically and electrically bonded to the antenna using standard flip-chip or other well known techniques.

Figure 14:
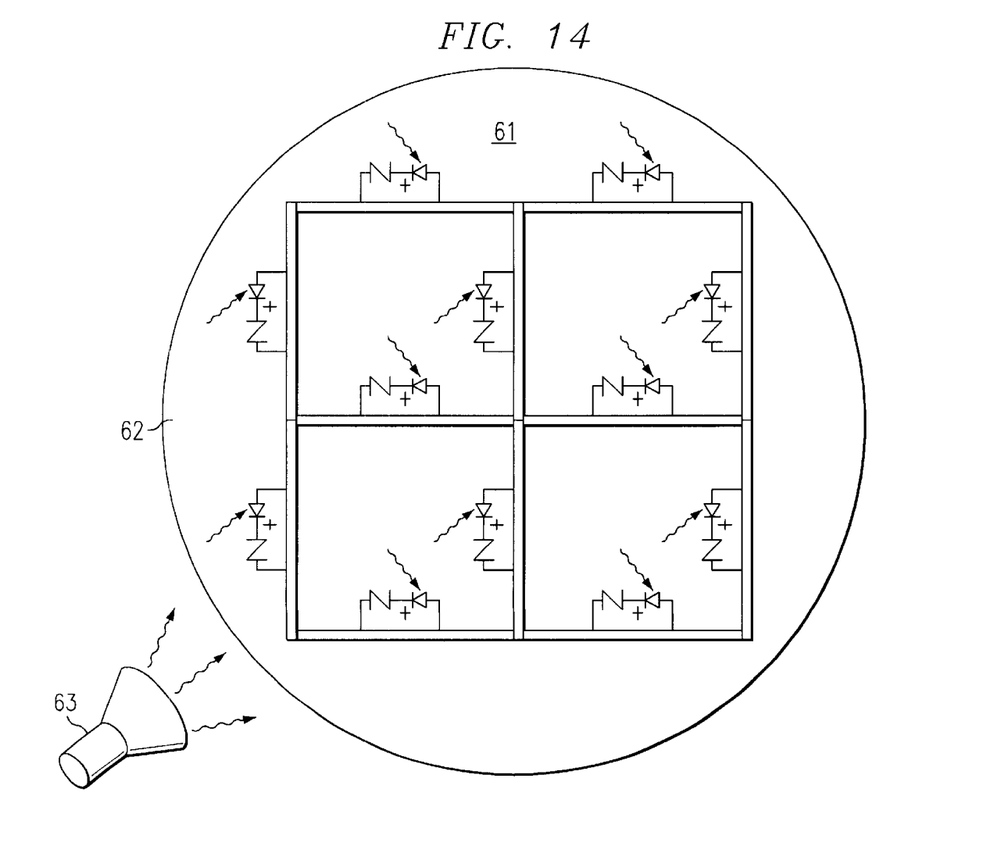
FIG. 14 illustrates an entire array pumped with light.

Referring to FIG. 14 is an illustration of an entire array 61 of resonant oscillators on a common substrate 62. Each oscillator is comprised of a dipole antenna and a RTD and photocell. The RTD and photocell are connected in series to form a set. The end terminals of each set are connected to each dipole such that the set is impedance-matched to the dipole. Each dipole oscillator may be made an electrical half wavelength long to permit the entire array to oscillate in a coherent, that is phase locked, manner. The array 61 of dipole oscillators is pumped by light from source 63. The intensity and uniformity of the light source are adjusted so that each dipole oscillator is equally powered.

In some uses of the invention, it may be desirable to fabricate the RTD and photocell on different substrates or by incompatible epitaxial growth methods. In one embodiment, the RTD may be fabricated on a separate substrate, mechanically or chemically diced into individual units, and then mechanically and electrically bonded to one of the photocell terminals using well know flip-chip or multi-chip module assembly.

What is claimed is:

1. An oscillator comprising:
   a resonant tunneling diode and
   a photocell coupled to said resonant tunneling diode for biasing said diode in response to light.

2. The oscillator of claim 1 wherein said photocell is integrated to power and bias the resonant tunneling diode.

3. The oscillator of claim 1 wherein said solar cell is a low leakage photocell with a high I–V solar cell response to match the tunneling diode.

4. A transducer comprising:

an antenna and an oscillator coupled to said antenna; said oscillator comprising: a resonant tunneling diode and a photocell coupled to said resonant tunneling diode for biasing said diode in response to light.

5. The transducer of claim 4 wherein said antenna is a traveling wave antenna.

6. The transducter of claim 5 wherein said resonant tunneling diode and said photocell are in series across side walls at a point from the end wall that resonates the system at the desired frequency.

7. The transducer of claim 4 wherein said antenna is a dipole antenna.

8. The transducter of claim 7 wherein said resonant tunneling diode and said photocell are in series across the center of the dipole.

9. The transducter of claim 4 is an oscillator.

10. An oscillator comprising:

an array of antennas;

an oscillator coupled to each antenna of said array of antennas; said oscillator comprising: a resonant tunneling diode and a solar cell coupled to said resonant tunneling diode for biasing said diode in response to light.

11. The oscillator of claim 10 wherein said each antenna is a dipole.

12. The oscillator of claim 10 wherein said array of antennas is on a common substrate.

* * * * *

UNITED STATES PATENT AND TRADEMARK OFFICE
CERTIFICATE OF CORRECTION

PATENT NO. : 6,359,520 B1  Page 1 of 1
DATED : March 19, 2002
INVENTOR(S) : Gary Frazier et al.

It is certified that error appears in the above-identified patent and that said Letters Patent is hereby corrected as shown below:

Column 2,
Line 31, after "Reddy", delete "et. al." and insert -- et al. --.
Line 34, after "Reddy", delete "et. al." and insert -- et al., --.
Line 35, after "M.", delete "Reedy." and insert -- Reddy, -- and delete "et. el.." and insert -- et al., --.
Line 40, after "source", delete "form", and insert -- from --.
Line 62, after "sitting", insert -- a --.

Column 4,
Line 33, after "current", delete "form", and insert -- from --.

Column 5,
Line 3, after "not", delete "impeded" and insert -- impede --.
Line 34, after "$R_{Photocell}$", delete "is".

Column 7,
Line 14, after "The", delete "transducter", and insert -- transducer --.

Column 8,
Line 1, after "The", delete "transducter", and insert -- transducer --.
Line 4, after "The", delete "transducter", and insert -- transducer --.

Signed and Sealed this

Twenty-third Day of July, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,359,520 B1                                                Page 1 of 1
DATED         : March 19, 2002
INVENTOR(S)   : Gary Frazier et al.

It is certified that error appears in the above-identified patent and that said Letters Patent is hereby corrected as shown below:

Column 1,
Line 31, after "Reddy", delete "et. al." and insert -- et al. --.
Line 34, after "Reddy", delete "et. al." and insert -- et al. --.

Column 2,
Line 62, after "sitting", delete "a a" and insert -- on a --.

Signed and Sealed this

Third Day of December, 2002

JAMES E. ROGAN
*Director of the United States Patent and Trademark Office*